United States Patent
Hsu et al.

(10) Patent No.: US 6,180,290 B1
(45) Date of Patent: Jan. 30, 2001

(54) MULTI-PHASE MASK USING MULTI-LAYER THIN FILMS

(75) Inventors: Jung-Hsien Hsu, Hsin-Chu; Sung-Mu Hsu, I-Lan, both of (TW)

(73) Assignee: Taiwan Semiconductor Manufacturing Company, Hsin-Chu (TW)

( * ) Notice: Under 35 U.S.C. 154(b), the term of this patent shall be extended for 0 days.

(21) Appl. No.: 09/163,385

(22) Filed: Sep. 30, 1998

Related U.S. Application Data

(62) Division of application No. 08/566,635, filed on Dec. 4, 1995.

(51) Int. Cl.[7] .................................................... G03F 9/00
(52) U.S. Cl. ............................................... 430/5; 430/322
(58) Field of Search ................................ 430/5, 322, 323, 430/313, 314

(56) References Cited

U.S. PATENT DOCUMENTS

| | | |
|---|---|---|
| 5,358,808 | 10/1994 | Nitayama et al. ........................ 430/5 |
| 5,376,483 | 12/1994 | Rolfson ..................................... 430/5 |
| 5,387,485 | 2/1995 | Sukegawa et al. ....................... 430/5 |
| 5,393,623 | 2/1995 | Kamon ...................................... 430/5 |
| 5,403,682 * | 4/1995 | Lin ............................................. 430/5 |
| 5,429,897 | 7/1995 | Yoshioka et al. ......................... 430/5 |
| 5,487,962 * | 1/1996 | Rolfson ..................................... 430/5 |
| 5,759,724 * | 6/1998 | Rolfson ..................................... 430/5 |

* cited by examiner

*Primary Examiner*—S. Rosasco
(74) *Attorney, Agent, or Firm*—George O. Saile; Stephen B. Ackerman; Larry J. Prescott

(57) ABSTRACT

This invention provides a multi-layer multi-phase phase shifting photomask and a method for fabricating the same. The photomask of this invention uses a number of phase shifting layers each layer providing less than 180° optical phase shift to provide a total optical phase shift of 180°. The multi-layer multi-phase phase shifting photomask provides a gradual transition form no phase shift to 180° phase shift at pattern edges thereby improving image quality. The patterns in the layers of phase shifting material are formed using non critical etching steps. The thickness of the phase shifting layers is controlled by the deposition of the layers of phase shifting material which is relatively easy to control.

9 Claims, 5 Drawing Sheets

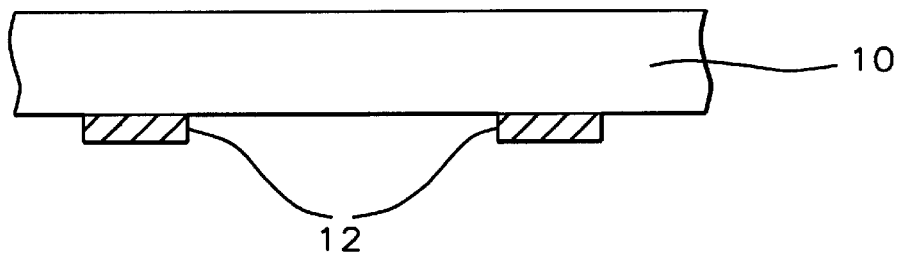
FIG. 1A – Prior Art
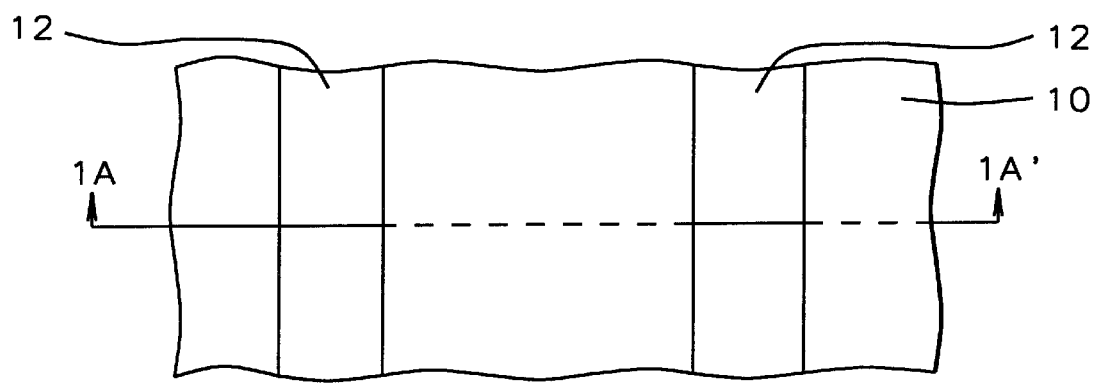
FIG. 1B – Prior Art
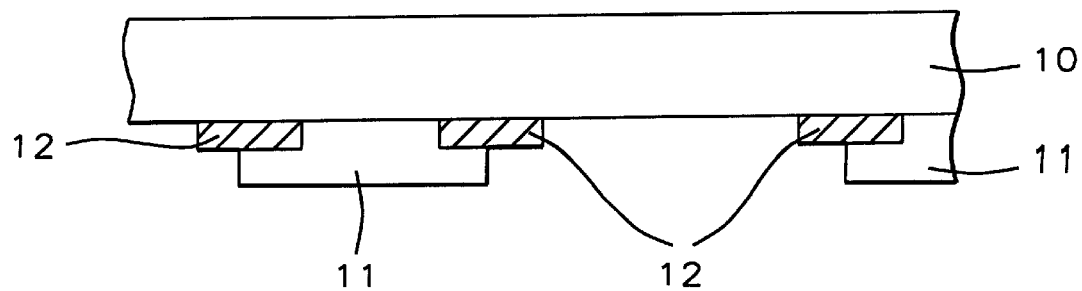
FIG. 2A – Prior Art

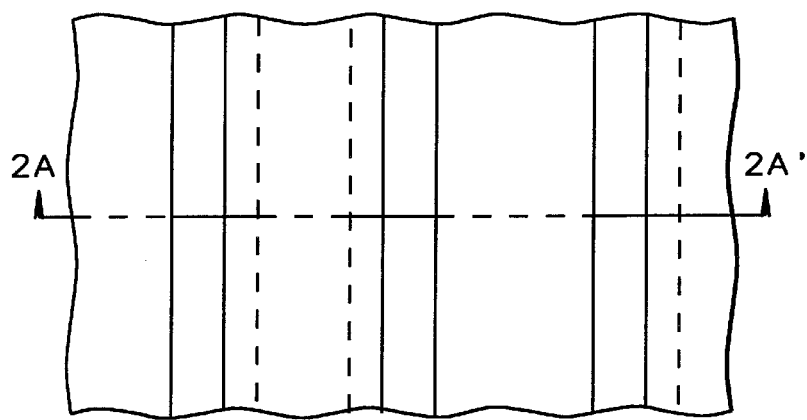
FIG. 2B - Prior Art
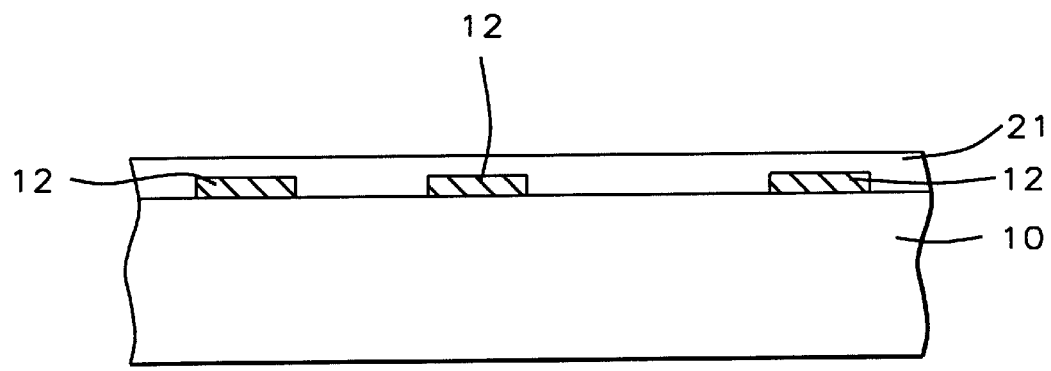
FIG. 3

MULTI-PHASE MASK USING MULTI-LAYER THIN FILMS

This is a division of patent application Ser. No. 08/566,635, filing date Dec. 4, 1995, Multi-Phase Mask Using Multi-Layer Thin Films, assigned to the same assignee as the present invention.

BACKGROUND OF THE INVENTION

(1) Field of the Invention

This invention relates to alternating type phase shifting photomasks and more particularly to multi-phase multi-layer phase shifting photomasks using phase shifting layers of less than 180° optical phase shift to form a mask having a total optical phase shift of 180°.

(2) Description of the Related Art

The use of phase shifting technology in masks used in projection systems to expose a layer of photoresist formed on a semiconductor substrate has become very important as the requirements of image definition and depth of focus have become more stringent. A number of workers have disclosed methods of forming and using phase shifting photomasks.

U.S. Pat. No. 5,358,808 to Nitayama et al. and U.S. Pat. No. 5,376,483 to Rolfson teach etching into a transparent mask substrate in addition to the formation of phase shifting material to provide photomasks having phase shifting regions with different optical lengths and different amounts of phase shift.

U.S. Pat. No. 5,403,682 to Lin teaches the use of phase shifting rims surrounding each pattern of a photomask.

U.S. Pat. No. 5,429,897 to Yoshioka et al. teaches the use of attenuating type phase shifting masks.

U.S. Pat. No. 5,393,623 to Kamon teaches the use of reflection type phase shifting photomasks.

U.S. Pat. No. 5,387,485 to Sukegawa et al. teaches the use of photomasks using annular arrangement of light shielding regions together with phase shifting material.

U.S. Pat. No. 5,246,800 to Muray teaches an alternating type phase shifting mask using a transition region having three different optical phases. The three phases are assigned to pixels, or subregions, in the transition region.

In the invention of this Patent Application uses an alternating type phase shifting photomask. The phase shifting region of the photomask is formed from a number of layers of phase shifting material. The total optical phase shift of the mask is 180° and the phase shift of each layer is less than 180°. The use of a multi-layer phase shifting photomask provides greater control of the phase shift during mask fabrication and a gradual transition between no phase shift and a phase shift of 180° which improves the quality of the image formed by the photomask.

The multi-layer mask is formed with an etching process having a wide tolerance with regard to etching times. The thickness control for the phase shifting layers is provided by control of the deposition of the layers.

SUMMARY OF THE INVENTION

The fabrication of integrated circuits places ever increasing requirements on photolithography to produce improved image definition and depth of focus. Conventional masks, such as shown in FIG. 1A and 1B, use an opaque pattern formed on a transparent substrate. FIG. 1A shows a cross section of such a photomask having an opaque pattern 12 formed of a material such as chrome formed on a transparent substrate 10 formed of a material such as quartz. FIG. 1B shows the top view of this type of mask.

Phase shifting photomasks, both rim type and alternating type, have been used to provide improved image definition and depth of focus however the fabrication of phase shifting photomasks is often difficult. Conventional alternating type phase shifting photomasks, such as shown in FIGS. 2A and 2B, provide a shift in optical phase of 180° at every other space. FIG. 2A shows a cross section of this type of mask showing an opaque pattern 12 and a pattern of phase shifting material 11 formed on a transparent substrate 10. FIG. 2B shows a top view of this type of mask. At the edges of the pattern of the phase shifting material an abrupt phase shift of 180° occurs which can produce undesirable effects in the image. In fabrication of phase shifting photomasks of this type etching times must be carefully controlled to insure the correct amount of phase shift.

It is a principle objective of this invention to provide a method of forming an alternating type multi-phase phase shifting mask from a multi-layer thin film structure which provides a large latitude in etching times used to form the mask.

It is another principle objective of this invention to provide an alternating type multi-layer multi-phase phase shifting photomask which provides a 180° optical phase shift at pattern edges in steps of less than 180° such as 45°, 60°, or 90°.

These objectives are achieved by depositing a number of layers of phase shifting material on a transparent mask substrate having a patterned layer of opaque material formed thereon. A first layer of first phase shifting material is deposited on the transparent mask substrate over the patterned layer of opaque material. A second layer of second phase shifting material is deposited on the layer of first phase shifting material. A third layer of first phase shifting material is then deposited on the second layer of second phase shifting material. A fourth layer of second phase shifting material is then deposited on the third layer of first phase shifting material. This example is for four layers of phase shifting material however the process can be terminated earlier if fewer than four layers is desired or can be continued in this manner if more than four layers of phase shifting material is desired.

Continuing with the four layer example a pattern is then formed in the fourth layer of second phase shifting material using a photoresist mask and etching with an etchant which will not etch the third layer of first phase shifting material. Next a pattern is formed in the third layer of first phase shifting material using a photoresist mask and an etchant which will not etch the second phase shifting material. Next a pattern is formed in the second layer of second phase shifting material using a photoresist mask and an etchant which will not etch the first phase shifting material. Finally, a pattern is formed in the first layer of first phase shifting material using a photoresist mask and an etchant which will not etch the second phase shifting material or the transparent substrate material.

The thickness of the phase shifting layers is determined when the layers are deposited and is very easily controlled. The etching method used to form the patterns has no effect on the thickness of the phase shifting layers so that control of etching time is not critical. The total optical phase shift in all of the layers used is 180° so that for a mask using four layers, for example, the thickness of each layer will be chosen to provide a phase shift of 45°.

At alternating edges of the mask pattern the mask is arranged so that, in a four layer mask for example, the light at the edge of the mask pattern will pass through one, two, three, and four layers of phase shifting material. This provides a gradual phase shift of 45°, 90°, 135°, and 180°. This gradual phase shift will improve the quality of the image formed by the mask.

BRIEF DESCRIPTION OF THE DRAWINGS

FIG. 1A shows a cross section view of a prior art non phase shifting photomask.

FIG. 1B shows a top view of the prior art non phase shifting photomask of FIG. 1A.

FIG. 2A shows a cross section view of a prior art alternating phase shifting photomask.

FIG. 2B shows a top view of the prior art alternating phase shifting photomask of FIG. 2A.

FIG. 3 shows a cross section of a transparent mask substrate with a patterned opaque layer and one phase shifting layer formed thereon.

DESCRIPTION OF THE PREFERRED EMBODIMENTS

Refer now to FIGS. 3–6, there is shown the preferred embodiment of the method of forming the multi-layer multi-phase shifting mask of this invention. As shown in FIG. 3 a first layer 21 of first phase shifting material is formed on a transparent substrate 10 having a patterned layer of opaque material 12 formed thereon. The first layer 21 of first phase shifting material covers the patterned layer of opaque material 12. The transparent substrate 10 is formed of a material such as quartz. The patterned layer of opaque material 12 is formed of a material such as chrome. The first phase shifting material is a material such as $Si_3N_4$ and is deposited to a thickness required to give the desired amount of optical phase shift, which will be described later.

Figure 4:
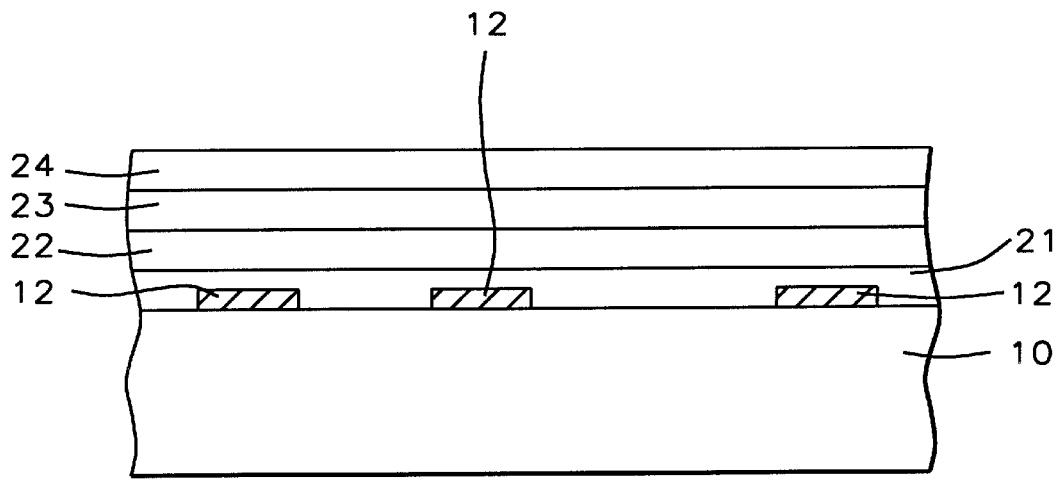
FIG. 4 shows a cross section of a transparent mask substrate with a patterned opaque layer and four phase shifting layers formed thereon.

As shown in FIG. 4 a second layer 22 of second phase shifting material is formed on the first layer 21 of first phase shifting material, a third layer 23 of first phase shifting material is formed on the second layer 22 of second phase shifting material, and a fourth layer 24 of second phase shifting material is formed on the third layer 23 of first phase shifting material. In this example the second phase shifting material is $SiO_2$ so the structure is a layer of $Si_3N_4$ formed over the quartz substrate 10 and patterned layer of chrome 12, followed by a layer of $SiO_2$ formed on the layer of $Si_3N_4$, followed by alternating layers of $SiO_2$ and $Si_3N_4$ until the desired number of layers is formed, four in this example.

The total optical phase shift of all phase shifting layers used is 180° so for the four layer phase shifting structure of this example each layer has an optical phase shift of 45°. The thickness of each layer of $Si_3N_4$ and of each layer of $SiO_2$ is chosen to have an optical phase shift of 45° for light having a wavelength of the light used to project the mask image on the workpiece. For a different number of layers in the structure the optical phase shift and thus the thickness of each layer will be different.

Figure 5:
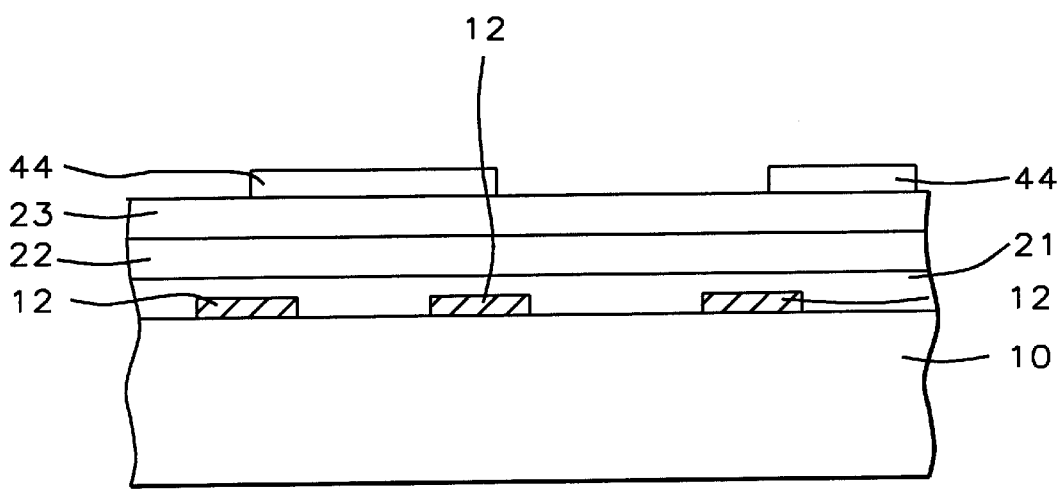
FIG. 5 shows a cross section of a transparent mask substrate with a patterned opaque layer and four phase shifting layers formed thereon, with a pattern formed in the topmost layer.
Figure 6:
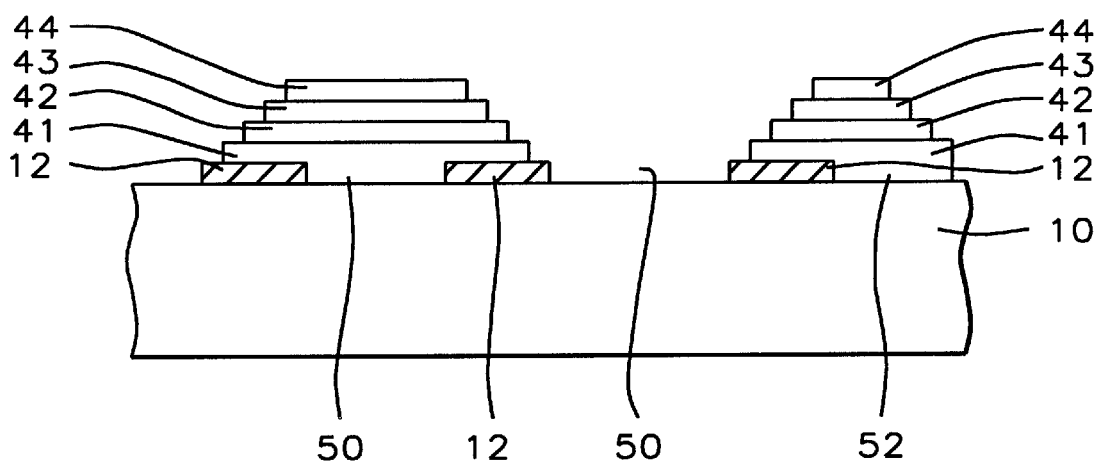
FIG. 6 shows a cross section of a transparent mask substrate with a patterned opaque layer and four phase shifting layers formed thereon, with patterns formed in all four phase shifting layers.

Next, as shown in FIG. 5, a fourth phase shifting pattern 44 is formed in the fourth phase shifting layer of $SiO_2$ using a photoresist mask and etching with a method, such as etching with a solution of hydrofluoric acid, which has a much greater etching rate for $SiO_2$ than for $Si_3N_4$ so that the time of etching is not a critical process parameter. As shown in FIG. 6, patterns are formed in the third, second, and first layers of phase shifting material in succession. A third phase shifting pattern 43 is formed in the third phase shifting layer of $Si_3N_4$ using a photoresist mask and etching with a method, such as etching with a hot phosphoric acid solution or dry etching, which has a much greater etching rate for $Si_3N_4$ than for $SiO_2$. Etching of $SiO_2$ and $Si_3N_4$ films is discussed in the book "SILICON PROCESSING FOR THE VLSI ERA, VOLUME 1," by S. Wolf and R. N. Tauber, 1986, Lattice Press, Sunset Beach, Calif., pages 532–534. A second phase shifting pattern 42 is formed in the second phase shifting layer and a first phase shifting pattern 41 is formed in the first phase shifting layer in like manner and in each case the etching time is not critical.

In this embodiment the patterns in the phase shifting layers are formed by etching steps with non critical timing. The thickness of the phase shifting layers is controlled during the deposition of the phase shifting layers.

Figure 7:
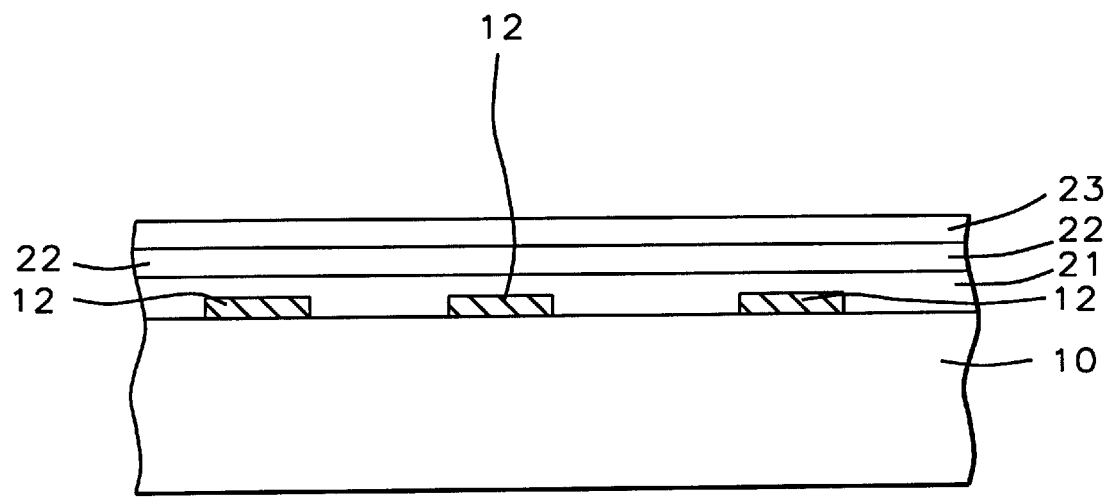
FIG. 7 shows a cross section of a transparent mask substrate with a patterned opaque layer and three phase shifting layers formed thereon, with patterns formed in all three phase shifting layers.
Figure 8:
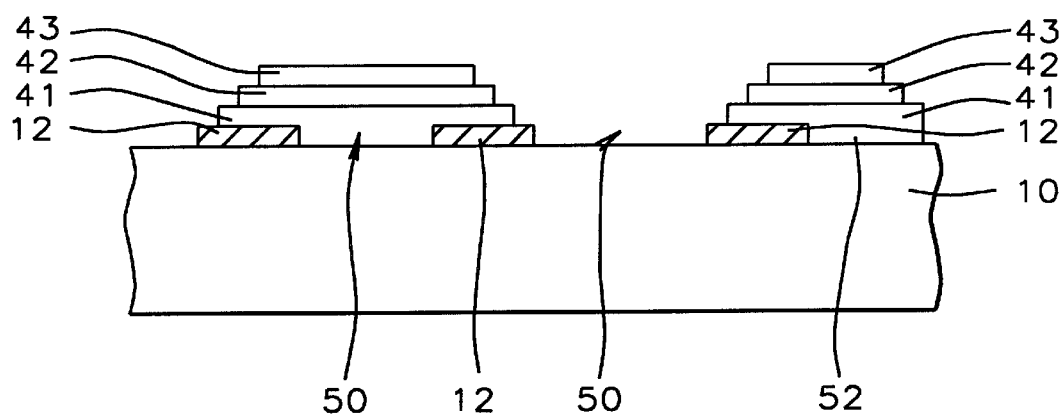
FIG. 8 shows a cross section of a transparent mask substrate with a patterned opaque layer and three phase shifting layers formed thereon, with patterns formed in all three phase shifting layers.

The multi-layer multi-phase shifting mask of this invention can be formed using a different number of phase shifting layers. FIGS. 7 and 8 show an embodiment of the multi-layer multi-phase shifting mask using three phase shifting layers. As shown in FIG. 7 a first layer of first phase shifting material 21 is formed on a transparent substrate 10 having a patterned layer of opaque material 12 formed thereon covering the patterned layer of opaque material. As in the previous embodiment, a second layer of second phase shifting material 22 is formed on the first layer of first phase shifting material 21, and a third layer of first phase shifting material 23 is formed on the second layer of second phase shifting material 22. The transparent substrate 10 is formed of a material such as quartz. The patterned layer of opaque material 12 is formed of a material such as chrome. The first phase shifting material is a material such as $Si_3N_4$ and the second phase shifting material is a material such as $SiO_2$. The thicknesses of the first, second, and third layers of phase shifting material are adjusted so that each layer of phase shifting material provides a phase shift of 60°. As shown in FIG. 8 patterns are then formed in the first, second, and third layers of phase shifting material as described in the previous embodiment.

FIG. 6 shows an embodiment of the multi-layer phase shifting mask of this invention using four phase shifting layers. The patterned layer of opaque material forms a pattern feature using a number of closely spaced opaque lines 12 and interior spaces 50 on the transparent substrate 10. The exterior space 52 at the edge of the pattern feature is larger than the interior spaces 50. The photomasks of this invention are alternating type photomasks so that phase shifting material provides a phase shift of 180° or 0° phase shift in alternating interior spaces 50. At the exterior spaces 52 the phase shifting material provides a gradual transition from 0° phase shift to 180° phase shift. In this embodiment where there are four layers of phase shifting material used so that the gradual transition from 0° phase shift to 180° phase shift in the exterior spaces 52 occurs in 45° increments.

FIG. 8 shows an embodiment of the multi-layer phase shifting mask of this invention using three phase shifting layers. The patterned layer of opaque material forms a pattern feature using a number of closely spaced opaque lines 12 and interior spaces 50 on the transparent substrate 10. The exterior space 52 at the edge of the pattern feature is larger than the interior spaces 50. The photomasks of this invention are alternating type photomasks so that phase shifting material provides a phase shift of 180° or 0° phase shift in alternating interior spaces 50. At the exterior spaces 52 the phase shifting material provides a gradual transition from 0° phase shift to 180° phase shift. In this embodiment where there are three layers of phase shifting material used so that the gradual transition from 0° phase shift to 180° phase shift in the exterior spaces 52 occurs in 60° increments.

While the invention has been particularly shown and described with reference to the preferred embodiments thereof, it will be understood by those skilled in the art that various changes in form and details may be made without departing from the spirit and scope of the invention.

What is claimed is:

1. A phase shifting photomask, comprising:
   a transparent mask substrate;
   a patterned layer of opaque material formed on said transparent mask substrate;
   a first phase shifting pattern having pattern edges formed from a first phase shifting material on said transparent mask substrate and said patterned layer of opaque material; and
   a second phase shifting pattern having pattern edgest formed from a second phase shifting material on said first phase shifting pattern wherein said first phase shifting material is different from said second phase shifting material, said first phase shifting pattern and said second phase shifting pattern each provide an optical phase shift of less than 180°, and said pattern edges of said second phase shifting pattern are within said pattern edges of said first phase shifting pattern.

2. The phase shifting photomask of claim 1 further comprising a third phase shifting pattern having pattern edges formed from said first phase shifting material on said second phase shifting pattern wherein said third phase shifting pattern provides an optical phase shift of less than 180° and said pattern edges of said third phase shifting pattern are within said pattern edges of said second phase shifting pattern.

3. The phase shifting photomask of claim 2 further comprising a fourth phase shifting pattern having pattern edges formed from-said second phase shifting material on said third phase shifting pattern wherein said fourth phase than 180° and said pattern edges of said fourth phase shifting pattern are within said pattern edges of said third phase shifting pattern.

4. The phase shifting photomask of claim 3 wherein said first phase shifting pattern is formed from $Si_3N_4$, said second phase shifting pattern is formed from $SiO_2$, said third phase shifting pattern is formed from $Si_3N_4$, and said fourth phase shifting pattern is formed from $SiO_2$.

5. The phase shifting photomask of claim 3 wherein said first phase shifting pattern, said second phase shifting pattern, said third phase shifting pattern, and said fourth phase shifting pattern each provide an optical phase shift of between about 36° and 54°.

6. The phase shifting photomask of claim 2 wherein said first phase shifting pattern is formed from $Si_3N_4$, said second phase shifting pattern is formed from $SiO_2$, and said third phase shifting pattern is formed from $Si_3N_4$.

7. The phase shifting photomask of claim 2 wherein said first phase shifting pattern, said second phase shifting pattern, and said third phase shifting pattern each provide an optical phase shift of between about 48° and 72°.

8. The phase shifting photomask of claim 1 wherein said first phase shifting pattern is formed from $Si_3N_4$ and said second phase shifting pattern is formed from $SiO_2$.

9. The phase shifting photomask of claim 1 wherein said first phase shifting pattern and said second phase shifting pattern each provide an optical phase shift of between about 72° and 108°.

* * * * *